United States Patent [19]

Miller et al.

[11] Patent Number: 5,303,938
[45] Date of Patent: Apr. 19, 1994

[54] KELVIN CHUCK APPARATUS AND METHOD OF MANUFACTURE

[76] Inventors: Donald C. Miller, 1139 Blair Ave., Sunnyvale, Calif. 94087; George L. Isaac, 980 Kiely Blvd. #326, Santa Clara, Calif. 95051

[21] Appl. No.: 38,619

[22] Filed: Mar. 25, 1993

[51] Int. Cl.$^5$ .............................................. B25B 11/00
[52] U.S. Cl. .......................................... 279/3; 269/21; 324/158 F; 29/846
[58] Field of Search .................. 279/3; 269/20, 21; 324/158 F; 29/846

[56] References Cited

FOREIGN PATENT DOCUMENTS

| 254790 | 3/1988 | Fed. Rep. of Germany ... 324/158 F |
| 254791 | 3/1988 | Fed. Rep. of Germany ... 324/158 F |
| 252642 | 11/1986 | Japan ............................... 324/158 F |

Primary Examiner—Steven C. Bishop

[57] ABSTRACT

A chuck for holding semiconductor wafers during testing of circuits formed thereon has a flat mounting surface with dual electrically isolated Kelvin contacts on the surface and passages communicating between the surface and a vacuum manifold for securing the wafers on the chuck with air pressure.

13 Claims, 1 Drawing Sheet

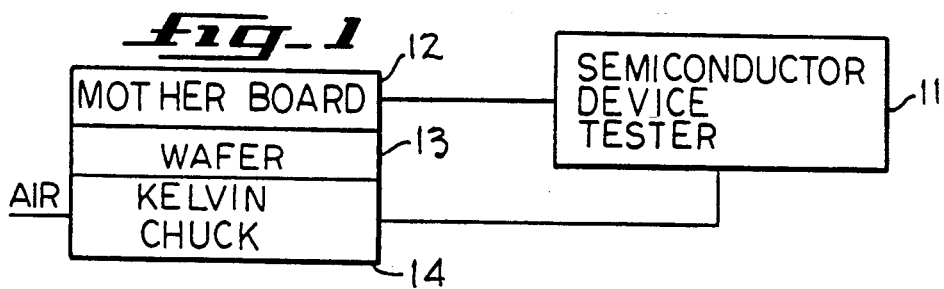
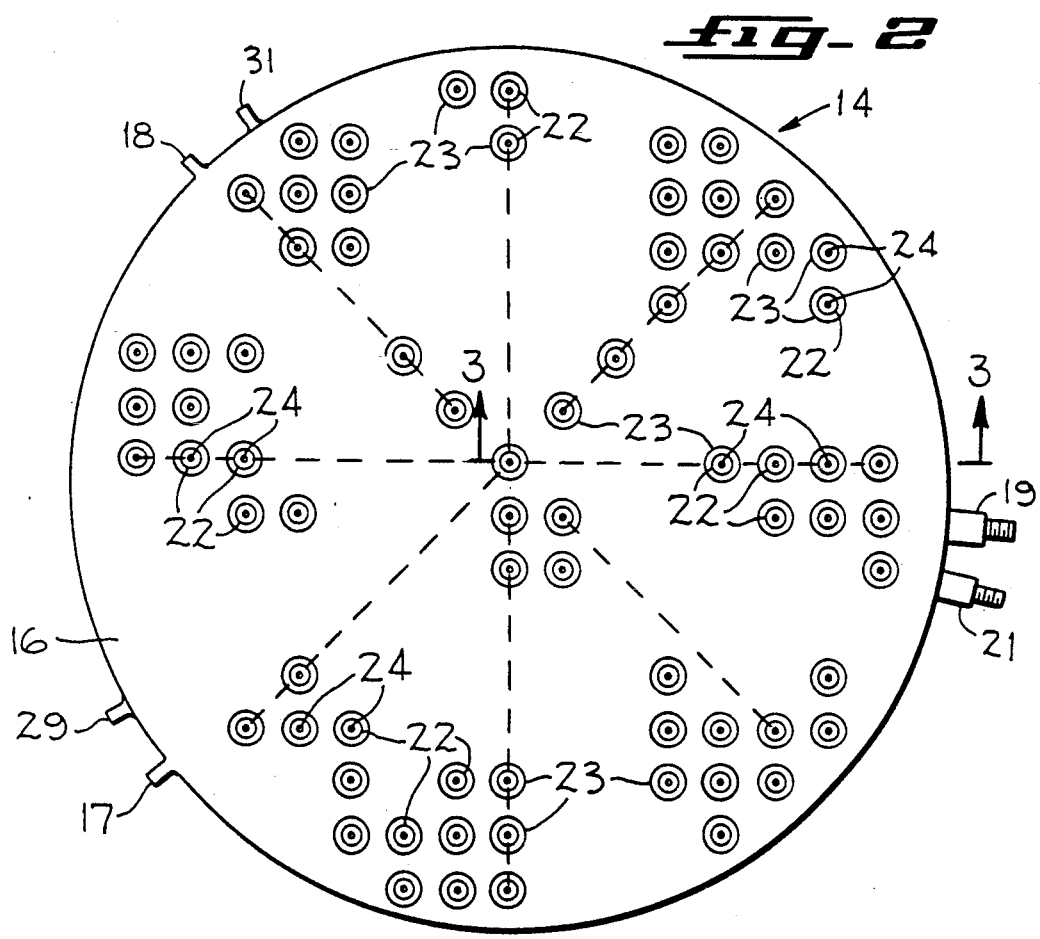
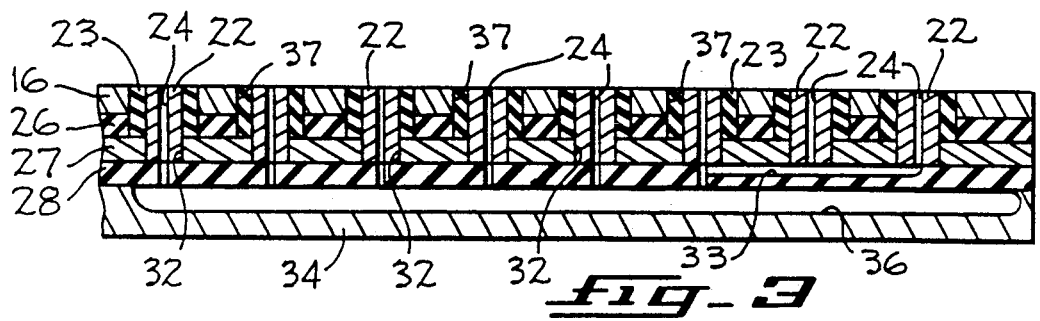

KELVIN CHUCK APPARATUS AND METHOD OF MANUFACTURE

SUMMARY OF THE INVENTION

This invention pertains to a chuck for use in securing and testing semiconductor circuits wherein a flat contact surface has first and second contact means on the contact surface. Means is provided for electrically isolating the first and second contact means and the flat contact surface has at least one opening therein. Means is also provided in communication with the opening or openings for applying a vacuum thereto, whereby a semiconductor circuit is affixed to the flat contact surface in electrical contact with the first and second contact means.

A semiconductor chuck has been developed for holding semiconductor circuits, wherein first contact means has a planar surface and a plurality of second contact means have surfaces substantially coplanar with the first contact means. Consequently, a contact surface is formed having first and second electrical contacts thereon. Further, means is provided for electrically isolating the plurality of second contact means from the first contact means and the contact surface has at least one opening therein. Manifold means is provided in communication with the opening or openings, so that low air pressure in the manifold means secures a semiconductor wafer to the contact surface which thereby provides dual electrical contact with the semiconductor wafer.

A semiconductor chuck for holding semiconductor wafers includes a first conducting layer, a first insulating layer, a second conducting layer and a second insulating layer, all bonded together in the foregoing succession plurality of conducting rods extends through the first insulating layer to the upper surface of the first conducting layer and in electrical contact with the second conducting layer. Insulators are disposed between the conducting rods and the fist conducting layer. Air manifold structure is connected to the second insulating layer. Certain ones of the conducting rods have axial holes therethrough and there are passages in the second insulating layer for communicating the air manifold structure with the axial conducting rod holes.

The invention also relates to a method of manufacturing a dual contact chuck for securing semiconductor wafers for processing which includes the steps of bonding an outer conductor layer to an inner insulating layer and bonding an inner conductor layer to the inner insulating layer to form a conductor-insulator-conductor sandwich. Thereafter the method includes drilling a plurality of first holes through the bonded outer conductor and inner insulating layers and plugging the drilled first holes with an insulating plug. A plurality of second holes are then drilled through the insulating plug and the inner conductor layer. Subsequently a plurality of conducting tubes is pressed into the second holes and into the inner conductor layer. The outer surface of the outer conductor layer is lapped so the outer surface and the ends of the conducting tubes are coplanar. A lower insulating layer is bonded to the inner conductor layer. A manifold is attached to the lower insulating layer. Thereafter, the manifold is communicated with the conducting tubes through the lower insulating layer, whereby dual contacts are provided on the lapped surface of the outer conductor layer and vacuum may be applied to the lapped surface through the conducting tubes.

BRIEF DESCRIPTION OF THE DRAWINGS

FIG. 1 shows the semiconductor chuck as used in a semiconductor wafer test system.

FIG. 2 is a plan view of the semiconductor chuck of the present invention.

FIG. 3 is a section view along the line 3—3 of FIG. 2.

DESCRIPTION OF THE PREFERRED EMBODIMENT

Precision electrical testing of circuits such as those contained on a semiconductor wafer requires that the test procedure impose minimal error. It is known to those practicing the electrical arts that measurement of voltage drop across a circuit is affected by voltage drop across any device in the circuit for measuring current and measurement of current in the circuit is affected by current, however small, which flows through the voltage measuring device. While both of these effects provide errors which for most applications are negligible, such errors in the field of semiconductor circuit testing may assume relatively major proportions and become unacceptable when testing such circuits. This appears to be the case particularly in testing field effect transistors, although such errors are unacceptable in many other semiconductor testing applications.

There is a principle discovered and developed by Lord Kelvin, an individual of some note in various fields of physics, which entails use of dual contacts in conducting electrical testing thereby providing a capability for obtaining test results in a circuit while eliminating or minimizing the errors arising from the use of the test equipment itself. Without delving into the dual contact principle of Lord Kelvin in detail or discussing the supporting theory therefor, the present invention may be disclosed in full as it pertains apparatus for providing the dual contact or test equipment for semiconductor devices as well as the method of manufacturing such apparatus.

With reference now to FIG. 1 of the drawing, a system is shown wherein a semiconductor device tester 11 is coupled to a mother board 12. The mother board is discussed in detail together with an integral component thereon, the semiconductor device test probe ring, in a patent application which is copending with this application and names an inventor who is also a coinventor in this application.

A semiconductor wafer 13 may be seen in FIG. 1 secured in position for testing by means of a Kelvin chuck 14, the subject of the invention disclosed herein. The chuck 14 may be seen to be connected to an air supply for drawing a vacuum within the chuck for purposes to be hereinafter addressed. The chuck 14 is also connected to the semiconductor device tester 11 through electrical contacts which will be also hereinafter described.

Turning now to FIG. 2 of the drawings, the Kelvin chuck 14 is seen in plan view and is, in the preferred embodiment about 6 inches in diameter. The surface of the chuck 14 is a brass disc 16 which affords one of the two contacts on the chuck surface. The first contact represented by the brass disc 16 has two electrical access terminals 17 and 18 as disclosed in this embodiment. An air inlet 19 and an air outlet 21 are also seen in FIG. 2 which serve purposes to be described in greater detail later. It should be noted in FIG. 2 that the surface of the Kelvin chuck 14 is characterized by a grid-like pattern of second contacts 22 which are coplanar with the first contact surface 16. The contacts 22 are surrounded by an insulating material 23 which maintains the second contacts in electrical isolation from the first contact surface 16. Additionally, a hole 24 is seen to extend axially through the second contacts 22 or at least through a predetermined number of the second contacts. A pattern of such holes is joined together for communication with the air inlet and outlet 19 and 21 in a manner to be hereinafter described. The pattern may be seen in FIG. 2 as shown by dashed lines to join certain series of holes 24 in contacts 22 on the surface of the chuck 14. This pattern of holes communicating with the air inlet and outlet is designed to firmly secure a semiconductor wafer to the surface of the Kelvin chuck 14 seen in FIG. 2.

With reference now to FIG. 3 of the drawings, the section along lines 3—3 of FIG. 2 shows the first contact 16 interrupted by a series of holes 37 which accept the insulator 23. The first contact 16 is a circular disc or plate of brass material which is about 1/10th of an inch in thickness in the preferred embodiment. The brass first contact 16 has an insulating layer 26 bonded thereto, having a lower side which in turn has another brass plate 27 bonded to it. The brass plates 16 and 27 are similar in size and electrical characteristics and the insulating layer 26 is also about 1/10th of an inch thick. Bonded to the bottom of the brass plate or disc 27 is another insulating layer 28 having a thickness similar to the thickness of insulating layer 26, thereby forming a four layer "sandwich".

The brass layer 27 is part of the second electrical contact and may be seen in FIG. 3 to be electrically joined with the contacts 22. A pair of contacts 29 and 31 are seen in FIG. 2 which provide electrical access to the brass plate 27 and therefore the second contacts on the surface of the Kelvin chuck 14 since the contacts 22 are press fit into holes 32 drilled in the brass plate 27. It should be noted that electrical access terminals 17 and 18 on brass disc 16 and terminals 29 and 31 on brass disc 27 are present for connection convenience only and do not represent isolated terminals on the respective brass discs. The holes 24 in the contacts 22, seen in FIG. 3, may extend all the way through the layered "sandwich" containing items 16, 26, 27 and 28 or they may communicate with a channel 33 formed in the second dielectric layer 28 underlying a series of holes 24 as seen at the right hand portion of FIG. 3. The dashed lines of FIG. 2 showing holes 24 joined to communicate with an air supply may represent a series of holes extending all the way through the layered sandwich as shown in the left hand portion of FIG. 3 or communicating with the chamber 33 formed in dielectric layer 28 as already mentioned. A manifold 34 is attached to the lower surface of second dielectric layer 28 as seen in FIG. 3. The manifold 34 has a manifold chamber 36 formed therein which serves to communicate with predetermined ones of the holes 24 as previously described in a pattern such as that described and illustrated by the dashed lines of FIG. 2.

One manner in which the Kelvin chuck 14 of the present invention may be manufactured will be described with reference now to FIG. 3. The first brass contact layer 16 is bonded to the underlying first dielectric layer 26, which in turn has bonded thereto the second brass contact layer 27. Thereafter, the brass-dielectric-brass "sandwich" has a series of holes 37 drilled therein so that the holes extend only through the brass layer 16 and the dielectric layer 26. An insulating plug of some material such as G-10 insulating material is pressed into each of the holes 37 and the holes 32 are in turn reamed axially through the center of the insulating plug to form the cylindrical insulator 23. The holes 32 are also extended through the second contact layer 27. A brass tube is pressed through the holes 32 into the second brass contact plate 27 to thereby provide electrical contact with the plate 27 from the upper surface of the Kelvin chuck 14 as seen in FIG. 3. The brass tube which forms the contacts 22 is about 3/10th of an inch long and has an axial hole 24 therein so that an additional drilling process to obtain this small hole 24 is unnecessary in the manufacture of the chuck disclosed herein. The second dielectric layer 28 then has a series of surface channels 33 formed therein prior to bonding to the lower side of plate 27 to provide the desired pattern, as represented by the dashed lines of FIG. 2, of holes communicated with the air inlet and outlet 19 and 21. The air inlet and outlet are in communication with the manifold chamber 36 so that when air pressure is lowered within the manifold chamber, external air pressure firmly secures a semiconductor wafer to the upper surface of the chuck 14. The upper surface of the chuck is lapped to provide a smooth surface on which to uniformly support the semiconductor wafers so that when a vacuum is drawn in the manifold chamber 36 air pressure does indeed firmly secure the semiconductor wafer to the surface of the chuck 14.

It may be seen that alternatively the holes 24 may be extended through the second dielectric layer 28 to provide direct access to the manifold chamber 36 in the desired pattern a shown by the dashed lines of FIG. 2.

As the foregoing illustrates, a Kelvin chuck 14 is provided which will securely support semiconductor discs 6 inches in diameter upon which semiconductor circuits have been deposited, and will provide two insulated electrical contacts to the semiconductor wafer so that errors imposed by testing equipment in testing the semiconductor circuits will be minimized or practically deleted altogether. It should be understood that the disclosed chuck is readily scaled up or down to support semiconductor wafers of 4 inches or 8 inches or any other reasonable and workable size. The sandwiched construction as disclosed herein lends itself to simple fabrication operations requiring only relatively loose tolerances in the parts forming the four layered construction which is attached to the manifold 34. In brief review, the formation of the three layered sandwich (layers 16, 26 and 27), is followed by drilling the blind holes 37, followed by plugging of the holes 37 and drilling of the holes 32 to form the insulator 23, reaming of the holes 32 all the way through the second brass contact plate 27, press fitting the contact tube 24 into the holes 32, forming the chambers 33 and/or an extension of the holes 24 in the second dielectric layer 28, and communicating the holes 22 and chambers 33 with the manifold chamber 36, and lapping the upper surface of the chuck to place the brass contact plate 16 and the ends of the contacts 22 in a common plane. This affords a relatively easy and straight forward method of fabricating the dual contact Kelvin chuck 14 for semiconductor circuit test disclosed herein.

Although the best mode contemplated for carrying out the present invention has been herein shown and described, it will be understood that modification and variation may be made without departing from what is regarded to be the subject matter of the invention.

What is claimed is:

1. A chuck for use in securing and testing semiconductor circuits, comprising
   a flat contact surface,
   first contact means on said contact surface,
   second contact means on said contact surface,
   means for electrically isolating said first and second contact means,
   said flat contact surface having at least one opening therein, and
   means in communication with said at least one opening for applying a vacuum thereto, whereby a semiconductor circuit is affixed to said flat contact surface in electrical contact with said first and second contact means.

2. A chuck as in claim 1 wherein said at least one opening comprises a plurality of openings spaced on said flat contact surface.

3. A chuck as in claim 1 wherein said second contact means comprises a plurality of spaced contacts flush with said flat contact surface.

4. A chuck as in claim 3 wherein said at least one opening extends through a plurality of said plurality of spaced contacts.

5. A chuck as in claim 1 wherein said first contact means comprises a planar surface coplanar with said second contact means, said second contact means comprising a plurality of electrically common spaced contacts.

6. A chuck as in claim 1 wherein said first and second contact means and said means for electrically isolating have coplanar surfaces.

7. A semiconductor chuck for holding semiconductor circuits, comprising
   first contact means having a planar surface,
   a plurality of second contact means having surfaces substantially coplanar with said first contact means, thereby forming a contact surface having first and second electrical contacts thereon,
   means for electrically isolating said plurality of second contact means from said first contact means,
   said contact surface having at least one opening therein, and
   manifold means in communication with said at least one opening, whereby low air pressure in said manifold means is used to secure a semiconductor wafer to said contact surface thereby providing dual electrical contact therewith.

8. A semiconductor chuck as in claim 7 wherein said plurality of second contact means comprises a plurality of conducting rods extending to said planar surface and a common conductor plate, and said means for electrically isolating comprises a plurality of dielectric sleeves extending to said planar surface and surrounding said conducting rods.

9. A semiconductor chuck as in claim 8 wherein said at least one opening comprises a plurality of openings axially directed through ones of said plurality of conducting rods.

10. A semiconductor chuck for holding semiconductor wafers comprising
    a first conducting layer having an upper and a lower surface,
    a first insulating layer bonded to said lower surface on said first conducting layer,
    a second conducting layer bonded to said first insulating layer,
    a second insulating layer bonded to said second conducting layer,
    a plurality of conducting rods extending through said first insulating layer to said upper surface on said first conducting layer and in electrical contact with said second conducting layer,
    insulating means disposed between said plurality of conducting rods and said first conducting layer, and
    air manifold means connected to said second insulating layer,
    ones of said plurality of conducting rods having axial holes therethrough,
    said second insulating layer having passages therein for communicating said air manifold means with said axial holes.

11. A method of manufacturing a dual contact chuck for securing semiconductor wafers for processing, comprising the steps of
    bonding an outer conductor layer to an inner insulating layer,
    drilling a plurality of first holes through the bonded outer conductor and inner insulating layers,
    bonding an inner conductor layer to the inner insulating layer,
    plugging the drilled first holes with an insulating plug,
    drilling a plurality of second holes through the insulating plus and the inner conductor layer,
    pressing a plurality of conducting tubes into the second holes and into the inner conductor layer,
    lapping the outer surface of the outer conductor layer so the outer surface and the ends of the conducting tubes are coplanar,
    bonding a lower insulating layer to the inner conductor layer,
    attaching a manifold to the lower insulating layer, and
    communicating the manifold with the conducting tubes through the lower insulating layer, whereby dual contacts are provided on the lapped surface and vacuum may be applied to the lapped surface through the conducting tubes.

12. The method of claim 11 wherein the step of communicating the manifold with the conducting tubes comprises the step of communicating a portion of the plurality of conducting tubes with the manifold.

13. The method of claim 11 wherein the step of communicating the manifold with the conducting tubes comprises the step of communicating a predetermined pattern of conducting tubes with the manifold.

* * * * *